United States Patent
Vukovic et al.

(10) Patent No.: US 10,256,121 B2
(45) Date of Patent: Apr. 9, 2019

(54) HEATED STAGE WITH VARIABLE THERMAL EMISSIVITY METHOD AND APPARATUS

(71) Applicant: Tokyo Electron Limited, Tokyo (JP)

(72) Inventors: Mirko Vukovic, Slingerlands, NY (US); Ronald Nasman, Averill Park, NY (US)

(73) Assignee: Tokyo Electron Limited, Tokyo (JP)

( * ) Notice: Subject to any disclaimer, the term of this patent is extended or adjusted under 35 U.S.C. 154(b) by 385 days.

(21) Appl. No.: 14/792,509

(22) Filed: Jul. 6, 2015

(65) Prior Publication Data
US 2017/0011975 A1    Jan. 12, 2017

(51) Int. Cl.
*H01L 21/67* (2006.01)
*H01L 21/285* (2006.01)

(52) U.S. Cl.
CPC .. *H01L 21/67103* (2013.01); *H01L 21/28556* (2013.01); *H01L 21/67109* (2013.01); *H01L 21/67115* (2013.01); *H01L 21/67248* (2013.01)

(58) Field of Classification Search
CPC ............... C23C 16/463; C23C 14/541; H01L 21/28556; H01L 21/67115
USPC ................................................. 118/724, 725
See application file for complete search history.

(56) References Cited

U.S. PATENT DOCUMENTS

| | | | |
|---|---|---|---|
| 6,803,546 B1 * | 10/2004 | Boas | C30B 25/10 118/50.1 |
| 7,159,397 B1 * | 1/2007 | Fleming | F03G 7/06 310/306 |
| 7,265,812 B2 | 9/2007 | Hara et al. | |
| 7,601,934 B2 | 10/2009 | Quach et al. | |
| 7,642,205 B2 | 1/2010 | Timans | |
| 7,745,762 B2 | 6/2010 | Timans | |
| 8,550,031 B2 | 10/2013 | Ishikawa et al. | |
| 8,557,721 B2 | 10/2013 | Timans | |
| 8,674,257 B2 | 3/2014 | Li | |
| 2005/0168813 A1 * | 8/2005 | Benning | G02F 1/135 359/443 |
| 2006/0291833 A1 * | 12/2006 | Timans | H01L 21/67115 392/416 |
| 2007/0090283 A1 * | 4/2007 | Linke | G02B 26/004 250/237 R |
| 2012/0171377 A1 * | 7/2012 | Volf | H01L 21/68757 427/255.28 |

(Continued)

*Primary Examiner* — Elizabeth A Burkhart
(74) *Attorney, Agent, or Firm* — Oblon, McClelland, Maier & Neustadt, L.L.P.

(57) ABSTRACT

Embodiments include a method for controlled cooling of a heated stage. The method includes setting a stage coupling to a maximum value and heating the stage to a process temperature. The method includes providing a wafer on the heated stage in a process chamber. The method includes performing a process on the wafer and reducing the heating stage coupling to a predetermined minimum value and reducing the heated stage temperature. The method includes removing the wafer from the heated stage and the process chamber. The heated stage is covered with a plurality of pixels, each pixel of the plurality of pixels include a level of emissivity and are equipped with an emissivity control device configured to independently adjust the level of emissivity of the pixel. The heated stage coupling is configured to achieve a predetermined radiative coupling and control the wafer cooling rate and target temperature.

21 Claims, 7 Drawing Sheets

(56) References Cited

U.S. PATENT DOCUMENTS

2012/0241695 A1\* 9/2012 Zhou .................... C09D 7/1275
252/519.2

\* cited by examiner

HEATED STAGE WITH VARIABLE THERMAL EMISSIVITY METHOD AND APPARATUS

BACKGROUND

Field of the Disclosure

This disclosure relates generally to the field of wafer processing equipment. More particularly, the present disclosure relates to a method and apparatus for controlling thermal emissivity of a heated stage and thereby controlling the temperature of wafers, such as semiconductor substrates.

Description of the Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Modern integrated circuits include semiconductor substrates or wafers. A wafer, also called a slice or substrate, is a thin slice of semiconductor material, such as a crystalline silicon, used in electronics for the fabrication of integrated circuits and in photovoltaics for conventional, wafer-based solar cells. The wafer serves as the substrate for microelectronic devices built in and over the wafer and undergoes many microfabrication process steps such as doping or ion implantation, etching, deposition of various materials, and photolithographic patterning. Finally the individual microcircuits are separated (dicing) and packaged.

Some high temperature processes require that the wafer be quickly cooled to room temperature to interrupt thermally induced chemical reactions on the wafer film. However, when the wafer is heated by a hot heated stage, the radiative coupling between the wafer and the heated stage couples the wafer cooling rate to that of the heated stage. This coupling may cause undesirable thermally induced chemical reactions on the wafer film.

SUMMARY

Embodiments include a method for controlled cooling of a heated stage. The method includes setting a stage coupling to a predetermined maximum value. The method also includes heating the stage to a predetermined process temperature. The method further includes providing a wafer on the heated stage in a process chamber, the process chamber having the heated stage and a showerhead, the heated stage at a first heated stage temperature, the showerhead at a first showerhead temperature, and the wafer at a first wafer temperature. The method also includes performing a process on the wafer. The method further includes reducing the heating stage coupling to a predetermined minimum value and reducing the heated stage temperature. The method also includes removing the wafer from the heated stage and the process chamber. The heated stage is covered with a plurality of pixels, each pixel of the plurality of pixels include a level of emissivity and are equipped with an emissivity control device configured to independently adjust the level of emissivity of the pixel. The heated stage coupling is configured to achieve a predetermined radiative coupling and control the wafer cooling rate and target temperature.

Embodiments also include a non-transitory computer readable medium encoded with instructions that, when executed in hardware, perform a process, the process comprising the method of setting a stage coupling to a predetermined maximum value. The method also includes heating the stage to a predetermined process temperature. The method further includes providing a wafer on the heated stage in a process chamber, the process chamber having the heated stage and a showerhead, the heated stage at a first heated stage temperature, the showerhead at a first showerhead temperature, and the wafer at a first wafer temperature. The method also includes performing a process on the wafer. The method further includes reducing the heating stage coupling to a predetermined minimum value and reducing the heated stage temperature. The method also includes removing the wafer from the heated stage and the process chamber. The heated stage is covered with a plurality of pixels, each pixel of the plurality of pixels include a level of emissivity and are equipped with an emissivity control device configured to independently adjust the level of emissivity of the pixel. The heated stage coupling is configured to achieve a predetermined radiative coupling and control the wafer cooling rate and target temperature.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE EMBODIMENTS

Referring now to the drawings, wherein like reference numerals designate identical or corresponding parts throughout the several views.

The present disclosure transcribes existing devices that operate at room temperature to high temperature operation. This disclosure presents methods to control the radiative coupling between a wafer and a heated stage by changing the heated stage emissivity (or equivalently, its reflectivity). This goal may be accomplished by changing the heated stage color in an appropriate wavelength range, such as between 1 and 30 micrometers (μm). In certain embodiments, for example, at 300° C., the peak emission is at 5 μm but while at 800° C. the peak emission is 2.7 μm.

The heated stage of the present disclosure may allow for fast control of wafer heating or cooling by radiation from the heated stage. If the radiative coupling between the wafer and the heated stage after process were reduced, the wafer would rapidly radiatively cool to a temperature close to the showerhead and process chamber or wall temperature.

In the present disclosure the heated stage surface may be covered by addressable pixels that can individually change their radiation reflection or absorption property. Thus, by individually controlling the radiation reflectivity profile across the heated stage, the wafer temperature profile may be controlled.

For example, upon the completion of process, and evacuation of process gases, the wafer temperature is determined by the radiative coupling between the wafer with the heated stage and with the showerhead. The wafer temperature will be determined by the relative coupling strength of the wafer with the heated stage and the showerhead.

Figure 1A:
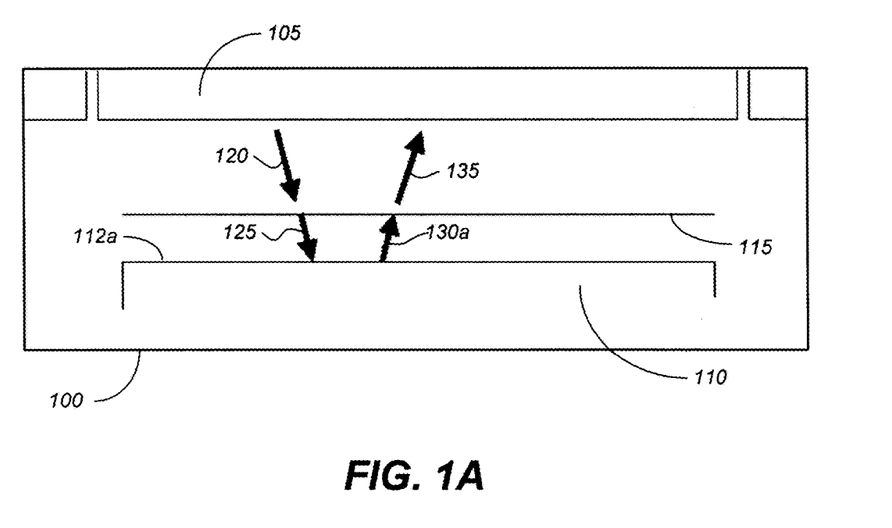
FIG. 1A is a schematic view of elements of a process chamber where a heated stage is well coupled to a wafer according to certain embodiments of the disclosure.
Figure 1B:
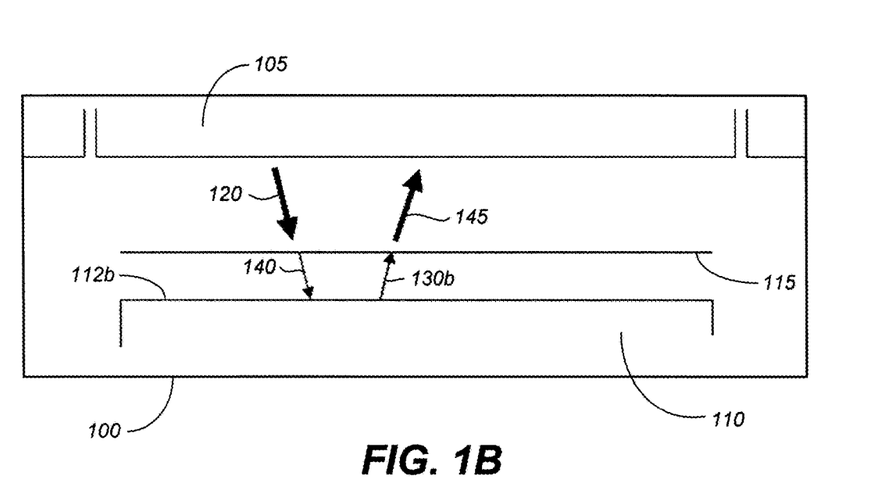
FIG. 1B is a schematic view of elements of a process chamber where a heated stage is weakly coupled to a wafer according to certain embodiments of the disclosure.

FIGS. 1A and 1B show two scenarios. FIG. 1A is a schematic view of elements of a process chamber 100 where a heated stage 110 is well coupled to a wafer 115 according to certain embodiments of the disclosure. In FIG. 1A, process chamber 100 may include a showerhead 105, a heated stage 110 including an uncontrolled surface 112a, and a wafer 115. In FIG. 1A, heated stage 110 is well coupled to wafer 115 via surface 112a which remains at an elevated (warm) temperature. FIG. 1A illustrates via arrows a heat flux (Watt/cm$^2$) 120 from showerhead 105 to wafer 115, a heat flux 125 from wafer 115 to stage 110, a heat flux 130a from stage 110 to wafer 115, and a heat flux 135 from wafer 115 to showerhead 105. It should be noted that heat flux 125 may be substantially the same as heat flux 135 in that the top and bottom surfaces of wafer 115 are at the same temperature. In certain embodiments, the heated stage temperature may be in the range of 300 to 550° C.

FIG. 1B is a schematic view of elements of a process chamber 100 where a heated stage 110 is weakly coupled to a wafer 115 according to certain embodiments of the disclosure. In FIG. 1B, process chamber 100 may include a showerhead 105, a heated stage 110 including a controlled surface 112b, and a wafer 115. In FIG. 1B, heated stage 110 is only weakly coupled to wafer 115 via surface 112b resulting in a reduced (cool) wafer heat flux. FIG. 1B illustrates via arrows heat flux 120 from showerhead 105 to wafer 115, a heat flux 140 from wafer 115 to stage 110, a heat flux 130b from stage 110 to wafer 115, and a heat flux 145 from wafer 115 to showerhead 105. It should be noted that heat flux 140 may be substantially the same as heat flux 145 in that the top and bottom surfaces of wafer 115 are at the same temperature.

It should be noted that due to the weak coupling of heated stage 110 and wafer 115 in FIG. 1B, the wafer 115 temperature is cooler than in FIG. 1A. It follows that by changing the coupling between the stage and the wafer, the wafer temperature will change.

In FIG. 1B, controlled surface 112b of heated stage 110 may be covered with an array of individually addressable pixels. These pixels may be configured to change their radiation emission properties, and thus radiation coupling with wafer 115. The heated stage 110 is covered with an array of pixels of dimension between 0.1 to 1 mm. Each pixel is individually addressed by a pair of control wires electrically connected to a controller 200 via an actuator 215 (see FIG. 2). This disclosure does not discuss the method of addressing individual pixels. It is expected that each pixel is controlled by its dedicated transistor circuit, capable of operation at process temperatures.

Thus, the heated stage surface 112b may be covered with an array of individually addressable pixels. These pixels can change their radiation emission properties, and thus radiative coupling with the wafer 115. In certain embodiments these pixels may be configured as a high-temperature electronic ink (see FIGS. 3A and 3B). In other embodiments these pixels may be configured as having surface 112b being covered with a MEMS micromirror array (see FIGS. 4A and 4B). Still, in other embodiments these pixels may be configured as cells filled with one of two fluids with opposite radiation properties (see FIGS. 5A and 5B).

In some embodiments, the wafer thickness limits the lateral temperature profile control to about 1 mm. Thus, pixel spatial scale may be about 1 mm. Further, turning the pixels on or off changes emissivity between two fixed values. Also, by using smaller size pixels an increase in the number of intermediate emissivity levels may be achieved.

Figure 2:
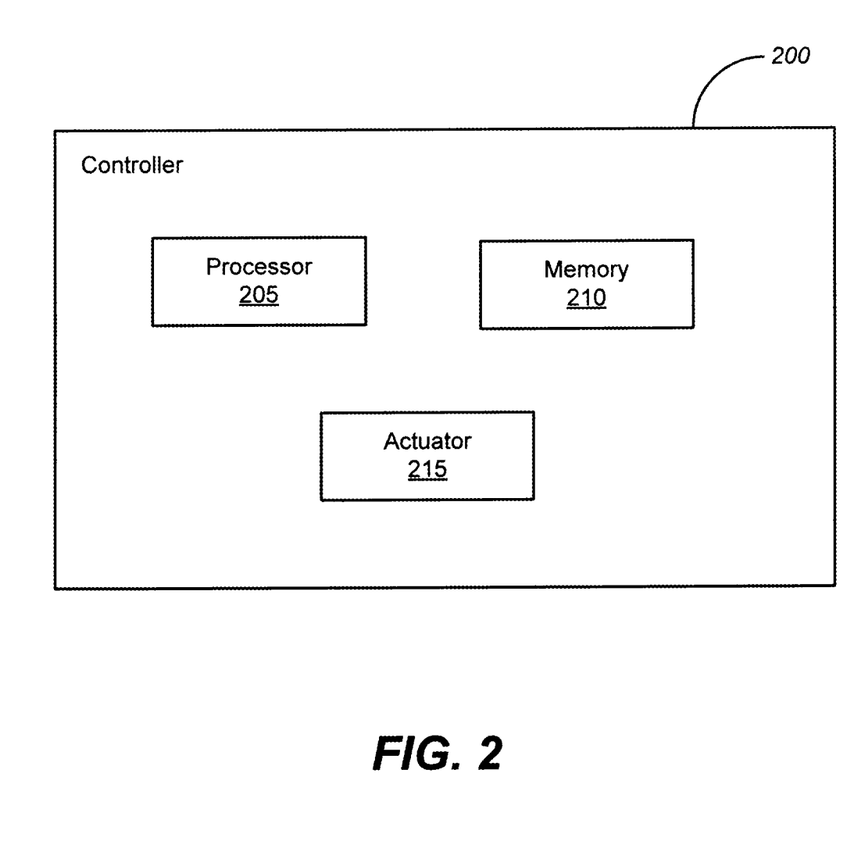
FIG. 2 is a block diagram of an emissivity controller according to certain embodiments of the disclosure.

FIG. 2 is a block diagram of an emissivity controller 200 according to certain embodiments of the disclosure. In FIG. 2, controller 200 may include at least one processor 205, at least one memory 210, and at least one actuator 215. Processor 205 may be a central processing unit (CPU) electrically connected to surface 112b and to processing chamber 100. Memory 210 may include ROM and/or RAM memory configured to store predetermined target cooling temperatures for various wafers 115. Actuator 215 may be electrically connected to pixel units or piezoelectric pumps as discussed below in detail.

Figure 3A:
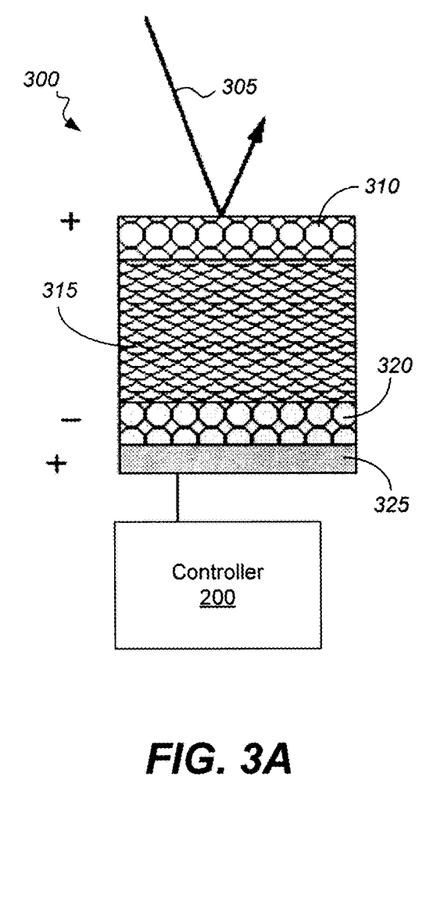
FIGS. 3A and 3B are schematic views of polarized pixels disposed on a surface of the heated stage according to certain embodiments of the disclosure.
Figure 3B:
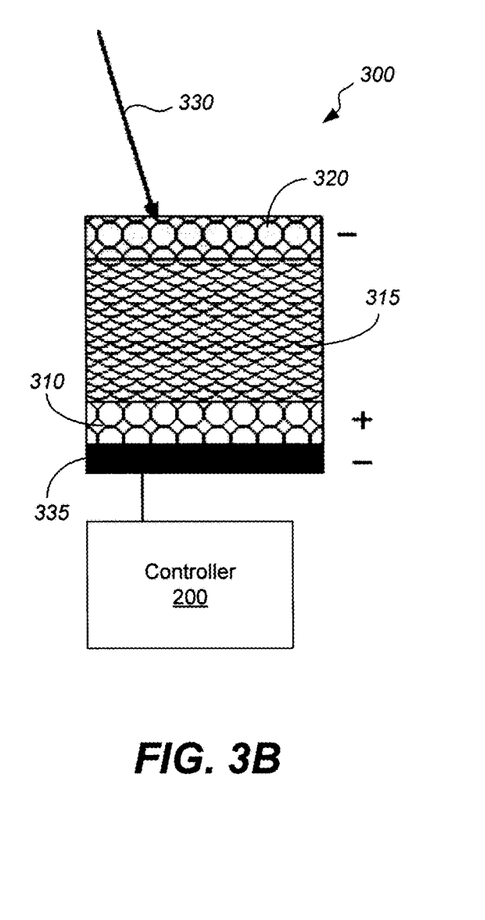

FIGS. 3A and 3B are schematic views of polarized pixels 300 disposed on surface 112b of heated stage 115 according to certain embodiments of the disclosure. In FIGS. 3A and 3B, polarized pixel 300 may be filled with a liquid 315, such as transparent oil. Liquid 315 is transparent to thermal radiation, that is, it has a very small absorbance. Further, polarized pixel 300 may be embedded with particulates or spheres 310, 320 having high and low radiation reflectivity and positive and negative electrical charge, respectively. Below each pixel is either a positively charged electrode 325 or a negatively charged electrode 335.

In FIGS. 3A and 3B, applying a potential segregates the particulates 310, 320 via controller 200. Charge of one polarity pushes the high reflectivity particles to heated stage surface 112b as shown in FIG. 1B, making the surface reflective (white) to incident energy 305. Charge of the opposite polarity pushes the high absorptivity particles to surface 112b, making the heated stage 110 absorbent (black) to incident energy 330. In this manner control the heated stage reflectivity may be achieved.

It should be noted that polarized pixel 300 may depend on the thermal stability of the liquid 315 and particulates 310, 320. Further, the thermal properties of liquid 315 in polarized pixel 300 determine the upper temperature limit of the heated stage 110 in operation. In some embodiments, oils may be used for operating temperatures up to 290° C., while molten salts may be used for operating temperatures up to 560° C. Also, the particulates 310, 320 are configured to keep their charge at the operating temperatures.

Figure 4A:
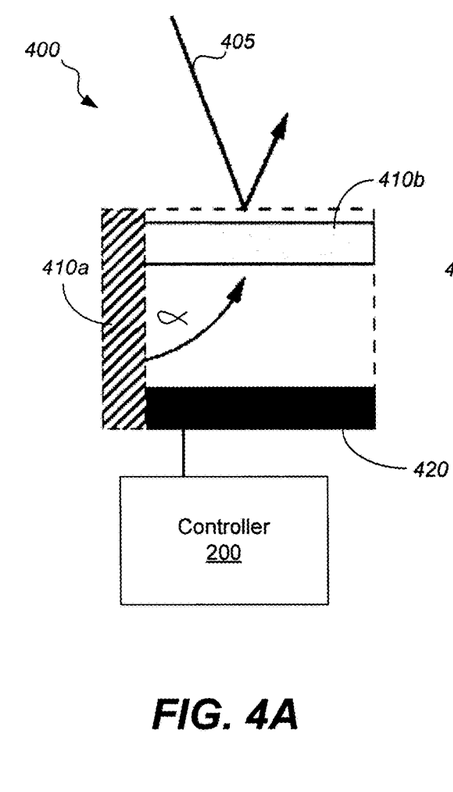
FIGS. 4A and 4B are schematic views of a microelectromechanical systems (MEMS) micromirror array made up of pixels disposed on a surface of the heated stage according to certain embodiments of the disclosure.
Figure 4B:
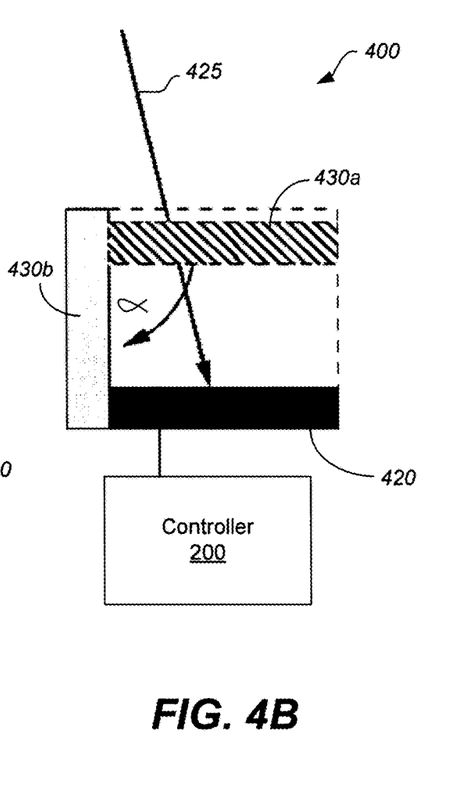

FIGS. 4A and 4B are schematic views of a microelectromechanical systems (MEMS) micromirror array made up of pixels 400 disposed on surface 112b of the heated stage 110 as shown in FIG. 1B according to certain embodiments of the disclosure. In FIG. 4A, pixel 400 may include reflective mirrors 410b configured to swivel from a first position at 410a to a second position at 410b during reflection of incident energy 405. The mirrors 410b are configured to have an adjustment range swivel of an angle α, where α may be about 90° from first position 410a at 0 degrees to second position 410b at 90 degrees. Thus, pixel 400 uses reflective mirrors 410b to make the heated stage 110 reflective to incident energy 405. Also, pixel 400 may include an absorbent surface 420 when reflection is not desired.

In FIG. 4B, pixel 400 may be configured to increase the heated stage emission coefficient by swinging the mirrors 430b to a vertical position at 430b from a horizontal position at 430a, thereby exposing absorbent surface 420. It should be noted that conventional micromirror arrays used in consumer applications are configured to swivel the mirrors an angle of about 10°. Controller 200 may be configured to electrically trigger and control the swivel of mirrors 410b and 430b, accordingly.

Figure 5A:
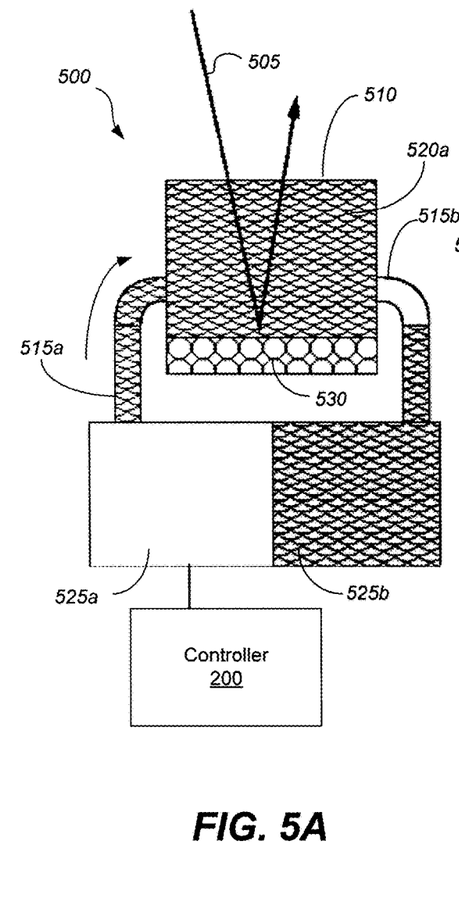
FIGS. 5A and 5B are schematic views of cells of immiscible fluids having opposite radiation properties disposed on a surface of the heated stage according to certain embodiments of the disclosure.
Figure 5B:
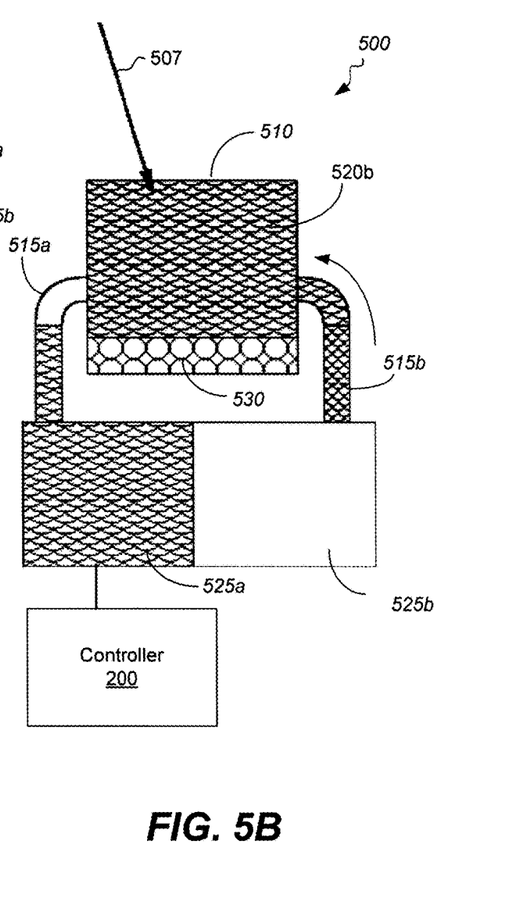

FIGS. 5A and 5B are schematic views of pixels or cells 500 of immiscible fluids 520a, 520b having opposite radiation properties disposed on surface 112b of heating stage 110 as shown in FIG. 1B according to certain embodiments of the disclosure. In FIGS. 5A and 5B, cell 500 may include a holding cell 510, piezoelectric pumps 515a, 515b, a first immiscible fluid 520a having a storage container 525a, a second immiscible fluid 520b having a storage container 525b, and particulates 530. Cells 500 may be electrically connected to controller 200 to activate and deactivate pumps 515a, 515b.

The two immiscible fluids 520a, 520b have opposite radiation properties. Immiscible fluids may include, for example, oils and molten salts. First immiscible fluid 520a has a very high transmittance of incident energy 505, while second immiscible fluid 520b has a very high absorbance of incident energy 507. Some embodiments include a transparent fluid which may be a gas or vacuum. Cell 500 includes particulates 530 reflective to the radiation disposed at a bottom portion of cell 500. Thus, for the case where first immiscible fluid 520a has a very high transmittance of incident energy 505 (transparent liquid), the heated stage 110 presents a reflective surface 112b. For the case where second immiscible fluid 520b has a very high absorbance (absorbent liquid), the heated stage 110 presents an absorbent surface 112b.

The first and second immiscible fluids 520a, 520b are pumped from their respective reservoirs 525a, 525b using, for example, piezoelectric pumps 515a, 515b, respectively.

In certain embodiments, the liquid temperature in each of cells 500 may range from 25° C. to 560° C. The liquid shield may have an absorbance coefficient ranging from 0.1 to 0.9 (dimensionless) and a transmittance coefficient ranging from 0.1 to 0.9 (dimensionless).

Figure 6:
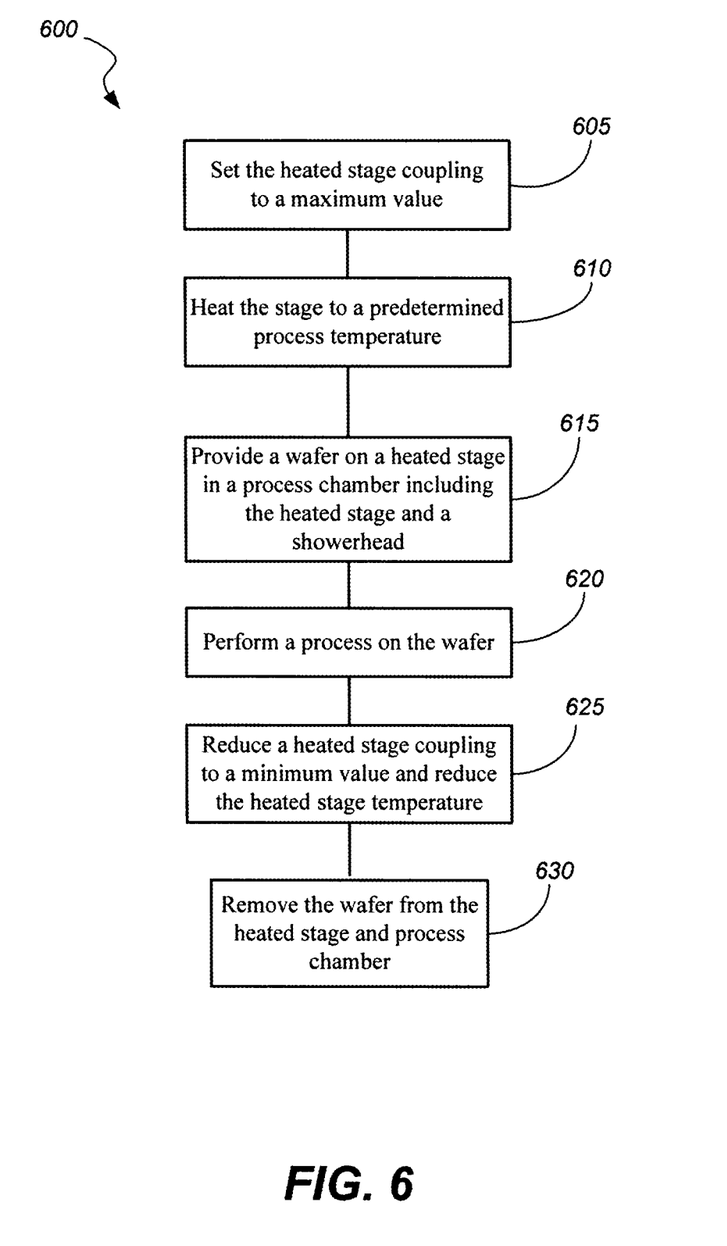
FIG. 6 is a flow diagram of a method for controlled cooling of a heated stage according to certain embodiments of the disclosure.

FIG. 6 is a flow diagram 600 of a method for controlled cooling of a heated stage 110 according to certain embodiments of the disclosure. In FIG. 6 at 605 includes setting the stage coupling to a maximum value. At 610 includes heating the stage to a predetermined process temperature, such as about 400° C. At 615 includes providing a wafer 115 on a heated stage 110 in a process chamber 100 including the heated stage 110 and a showerhead 105. Next, wait for a predetermined period for the wafer 115 to warm up to a process temperature. At 620 includes performing a process on the wafer. At 625 includes reducing a heated stage coupling to a minimum value via the emissivity controller 200 to meet a cooling target temperature having a cool down rate of about 1.5 to 2.5° C./s. At 630 start reducing the heated stage temperature to an idle temperature. In some embodiments steps 625 and 630 may occur simultaneously. At 635 includes removing the wafer 115 from the heated stage 110 and process chamber 100 while the heated stage temperature drops based on predetermined conditions. While the above steps have been described in a sequence, some steps may be performed sequentially while others may occur concurrently.

Figure 7:
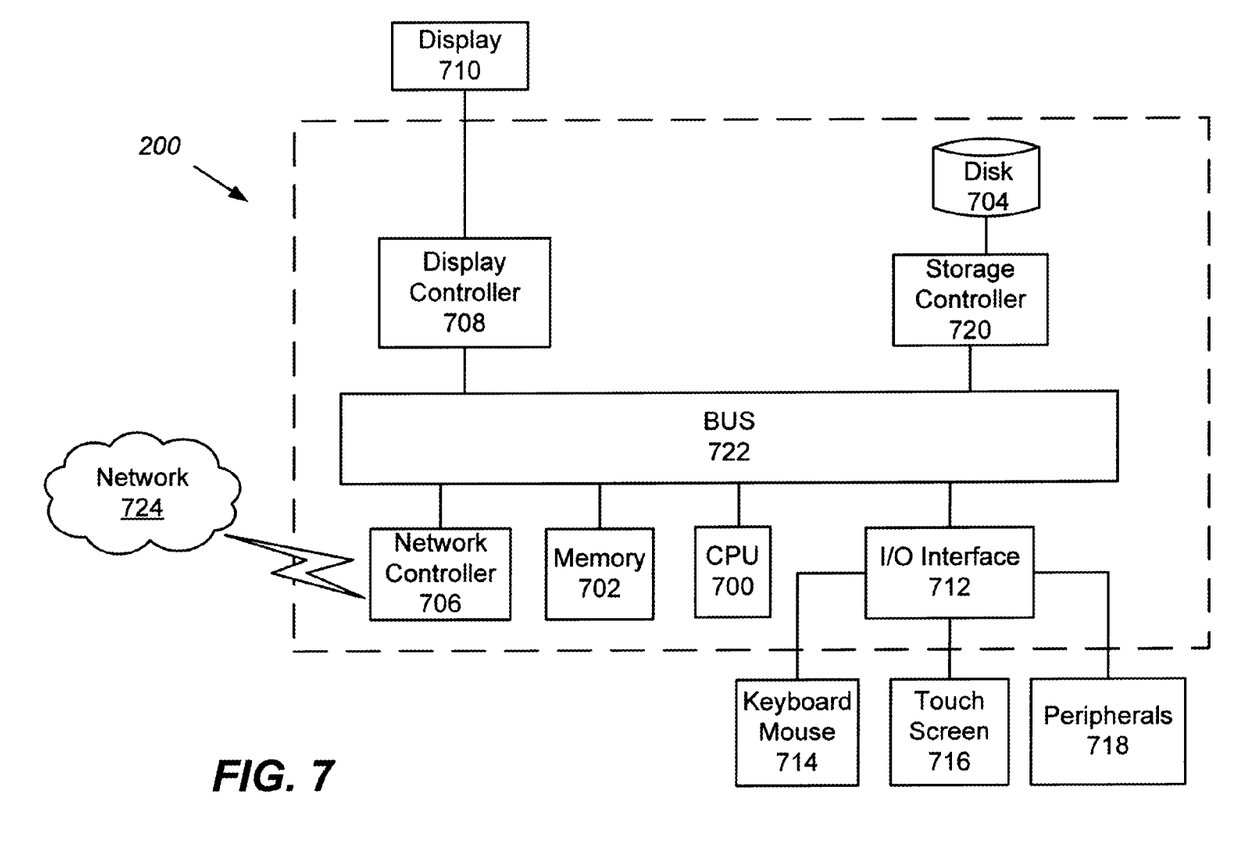
FIG. 7 is a schematic view of the emissivity controller according to certain embodiments of the disclosure.

FIG. 7 is a schematic view of the emissivity controller 200 according to certain embodiments of the disclosure. Next, a hardware description of the emissivity controller 200 according to exemplary embodiments is described with reference to FIG. 7. In FIG. 7, the controller 200 includes a CPU 700 which performs the processes described above/below. The process data and instructions may be stored in memory 702. These processes and instructions may also be stored on a storage medium disk 704 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the controller 200 communicates, such as a server or computer.

Further, the claimed advancements may be provided as a utility application, background daemon, or component of an operating system, or combination thereof, executing in conjunction with CPU 700 and an operating system such as Microsoft Windows 7, UNIX, Solaris, LINUX, Apple MAC-OS and other systems known to those skilled in the art.

The hardware elements in order to achieve the controller 200 may be realized by various circuitry elements, known to those skilled in the art. For example, CPU 700 may be a Xenon or Core processor from Intel of America or an Opteron processor from AMD of America, or may be other processor types that would be recognized by one of ordinary skill in the art. Alternatively, the CPU 700 may be implemented on an FPGA, ASIC, PLD or using discrete logic circuits, as one of ordinary skill in the art would recognize. Further, CPU 700 may be implemented as multiple processors cooperatively working in parallel to perform the instructions of the inventive processes described above.

The controller 200 in FIG. 7 also includes a network controller 706, such as an Intel Ethernet PRO network interface card from Intel Corporation of America, for interfacing with network 724. As can be appreciated, the network 724 can be a public network, such as the Internet, or a private network such as an LAN or WAN network, or any combination thereof and can also include PSTN or ISDN subnetworks. The network 724 can also be wired, such as an Ethernet network, or can be wireless such as a cellular network including EDGE, 3G and 4G wireless cellular systems. The wireless network can also be WiFi, Bluetooth, or any other wireless form of communication that is known.

The controller 200 further includes a display controller 708, such as a NVIDIA GeForce GTX or Quadro graphics adaptor from NVIDIA Corporation of America for interfacing with display 710, such as a Hewlett Packard HPL2445w LCD monitor. A general purpose I/O interface 712 interfaces with a keyboard and/or mouse 714 as well as a touch screen panel 716 on or separate from display 710. General purpose I/O interface also connects to a variety of peripherals 718 including printers and scanners, such as an OfficeJet or DeskJet from Hewlett Packard.

The general purpose storage controller 720 connects the storage medium disk 704 with communication bus 722, which may be an ISA, EISA, VESA, PCI, or similar, for interconnecting all of the components of the controller 200. A description of the general features and functionality of the display 710, keyboard and/or mouse 714, as well as the display controller 708, storage controller 720, network controller 706, and general purpose I/O interface 712 is omitted herein for brevity as these features are known.

The above-described hardware description is a non-limiting example of corresponding structure for performing the functionality described herein.

In some embodiments, heated stage 110 may have an emissivity coefficient ranging from 0.1 to 0.9 (dimensionless). Heated stage 110 may also have a reflectivity coefficient ranging from 0.1 to 0.9 (dimensionless). Heated stage 110 may have a wavelength color of about 1 to 30 μm. Heated state 110 may reach temperatures ranging from 300° C. to 550° C. Further, pixel size may range from 0.05 to 0.2 mm. Further, the coupling strength of the heated stage 110 to wafer 115 may be gravitationally bound.

In some embodiments the pixel size is fixed. Current pixel manufacturing technology limits the size of each pixel to some fraction of a millimeter, such as 0.1 mm. Because wafer thickness is about 0.5 mm, it may be impossible to impose temperature gradients over shorter distances. Thus, the temperature at each point in the heated stage 110 is influenced by pixels within a 0.5 mm radius. In other words, this area amounts to a level of emissivity in the pixel is affected by a range of 1 to 15 surrounding pixels. Since each individual pixel can be set, there are effectively up to 15 levels of emission.

Example Use Cases

High temperature TiN CVD:

The wafer is placed on a 400° C. heated stage with the process chamber walls at 170° C. Gases such as TiCl, NH, and $N_2$ are used during TiN deposition while $ClF_3$ is used for chamber cleaning.

After completion of the process, the process gases are evacuated, but chemical reactions between TiN and residual or adsorbed species (such as H2O and $O_2$) continue on the wafer surface producing oxides such as $TiO_x$ or TiON. Rapidly cooling the wafer will quench these reactions.

In high vacuum, heat transport is by radiation, and the wafer is in radiative equilibrium between the hot heated stage and cool process chamber walls. The heated stage has no active cooling—it also cools by radiation, a very slow process. Thus, without active measures, the wafer will remain at process temperature.

However, reducing the heated stage emissivity by the above disclosure apparatus and method may result in decoupling the wafer from the heated stage. The wafer temperature then drifts towards that of the processing chamber. For the above stated conditions and emissivities in the range of about 0.2-0.7, the calculated initial wafer cool down rate is at about 2° C./s.

For thermally activated reactions, small changes in temperature result in large rate changes. Thus a 50° C. change will substantially reduce the reaction rate.

Temperature Uniformity Control:

The disclosure apparatus and method may also be used for control of wafer temperature distribution. Spatial modulation of the heated stage emissivity can be used to offset effects of process non-uniformity, or of the heated stage heater non-uniformity.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A method for controlled cooling of a heated stage, the method comprising:
setting a stage coupling to a predetermined maximum value;
heating the stage to a predetermined process temperature;
providing a wafer on the heated stage in a process chamber, the process chamber having the heated stage and a showerhead, the heated stage at a first heated stage temperature, the showerhead at a first showerhead temperature, and the wafer at a first wafer temperature;
performing a process on the wafer;
reducing the heated stage coupling to a predetermined minimum value;
reducing the heated stage temperature; and
removing the wafer from the heated stage and the process chamber,
wherein the heated stage is covered with a pixel array including multiple adjacent pixels, each one of the pixels of the pixel array includes a level of emissivity and is equipped with an emissivity control device configured to independently adjust the level of emissivity of the respective pixel, and
wherein the heated stage coupling is configured to achieve a predetermined mapping of radiative coupling to spatially control a wafer cooling rate and a target temperature, and control wafer temperature distribution based on a radiation reflectivity profile of the pixel array.

2. The method according to claim 1, wherein the predetermined mapping of radiative coupling includes a target wafer cool down rate.

3. The method according to claim 2, wherein the target wafer cool down rate is in a range of 1.5 to 2.5 degrees C. per second.

4. The method according to claim 1, wherein the predetermined mapping of radiative coupling further includes spatial modulation of emissivity of the heated stage and heated stage temperature uniformity.

5. The method according to claim 1, wherein the emissivity control device is configured with a dedicated control circuit configured to operate in the first heated stage temperature.

6. The method according to claim 1, wherein size of the pixel is in a range from 0.05 to 0.20 mm.

7. The method according to claim 1, wherein the level of emissivity in the pixel is affected by a range of 1 to 15 surrounding pixels.

8. The method according to claim 1, wherein the first heated stage temperature is in a range from 300 to 550 degrees C.

9. The method according to claim 1, wherein the heated stage has an emissivity coefficient that is in a range from 0.1 to 0.9 and a reflectivity coefficient that is in a range from 0.1 to 0.9.

10. The method according to claim 1, wherein the emissivity control device utilizes an electronic ink reflectivity changer.

11. The method according to claim 10, wherein the electronic ink reflectivity changer comprise a reflectivity liquid, the reflectivity liquid comprising high reflectivity particles and low reflectivity particles.

12. The method according to claim 11, wherein a first potential is applied to the electronic ink reflectivity changer to alter a position of the high reflectivity particles and a second potential is applied to the electronic ink reflectivity changer to alter a position of the low reflectivity particles so as to make a surface of the heated stage reflective or absorbent, respectively.

13. The method according to claim 12, wherein the reflectivity liquid is any one of oil and molten salts.

14. The method according to claim 1, wherein the emissivity control device utilizes a micromirror array.

15. The method according to claim 14, wherein the micromirror array uses one or more reflective mirrors.

16. The method according to claim 14, wherein the micromirror array is adjusted to a vertical position to increase or decrease exposure of an absorbent surface of the micromirror array.

17. The method according to claim 14, wherein an adjustment of the micromirror array ranges from 0 to 90 degrees.

18. The method according to claim 1, wherein the emissivity control device utilizes pixels filled with immiscible fluids wherein a first immiscible fluid has a high transmittance and a second immiscible fluid has a high absorbance.

19. The method according to claim 18, wherein the first immiscible fluid and the second immiscible fluid are pumped from respective reservoirs via piezoelectric actuators.

20. The method according to claim 1, further comprising:
controlling the emissivity control device to meet the target temperature based on measured temperatures of one or more areas on the wafer.

21. A non-transitory computer readable medium encoded with instructions that, when executed in hardware, perform a process, the process comprising the method according to claim 1.

* * * * *